United States Patent
Bendjedia et al.

(10) Patent No.: US 11,313,916 B2
(45) Date of Patent: Apr. 26, 2022

(54) TESTABILITY METHOD FOR AN ELECTRONIC POWER CHAIN ASSOCIATED WITH AN ELECTRIC MOTOR

(71) Applicant: Safran Nacelles, Gonfreville l'Orcher (FR)

(72) Inventors: Moussa Bendjedia, Moissy Cramayel (FR); Kambiz Tehrani, Moissy Cramayel (FR); Ghaleb Hoblos, Moissy Cramayel (FR); Alain Nourrisson, Moissy Cramayel (FR); Julien Corbin, Moissy Cramayel (FR); Hakim Maalioune, Moissy Cramayel (FR)

(73) Assignee: Safran Nacelles, Gonfreville l'Orcher (FR)

( * ) Notice: Subject to any disclaimer, the term of this patent is extended or adjusted under 35 U.S.C. 154(b) by 271 days.

(21) Appl. No.: 16/705,987

(22) Filed: Dec. 6, 2019

(65) Prior Publication Data
US 2020/0110137 A1 Apr. 9, 2020

Related U.S. Application Data

(63) Continuation of application No. PCT/FR2018/051279, filed on Jun. 1, 2018.

(30) Foreign Application Priority Data

Jun. 6, 2017 (FR) ..................... 17/55005

(51) Int. Cl.
*G01R 31/42* (2006.01)
*H02P 29/024* (2016.01)
*G01R 31/00* (2006.01)
*G01R 31/34* (2020.01)
*H02P 27/06* (2006.01)

(52) U.S. Cl.
CPC ........... *G01R 31/42* (2013.01); *G01R 31/008* (2013.01); *G01R 31/346* (2013.01); *H02P 27/06* (2013.01); *H02P 29/0241* (2016.02)

(58) Field of Classification Search
CPC .... G01R 31/42; G01R 31/008; G01R 31/346; H02P 27/06; H02P 29/0241
USPC ........................................ 324/503
See application file for complete search history.

(56) References Cited

U.S. PATENT DOCUMENTS

| | | | |
|---|---|---|---|
| 5,363,039 A | 11/1994 | Kumar et al. | |
| 2011/0050277 A1* | 3/2011 | Maalioune | F02K 1/72 324/765.01 |
| 2012/0217920 A1 | 8/2012 | Singh et al. | |
| 2014/0152224 A1 | 6/2014 | Enomoto et al. | |
| 2014/0347067 A1* | 11/2014 | Hirono | H02P 29/0241 324/537 |

OTHER PUBLICATIONS

International Search Report for International Application PCT/FR2018/051279, dated Aug. 31, 2018.

* cited by examiner

*Primary Examiner* — Farhana A Hoque
(74) *Attorney, Agent, or Firm* — Burris Law, PLLC

(57) ABSTRACT

A testability method for the in-flight testing of an operating state of an electronic power chain having at least one power converter intended for driving an electric motor that actuates at least one aircraft component includes controlling actuation of the converter, transmitting a test signal, collecting at least one measurement signal, and determining an operating state.

8 Claims, 5 Drawing Sheets

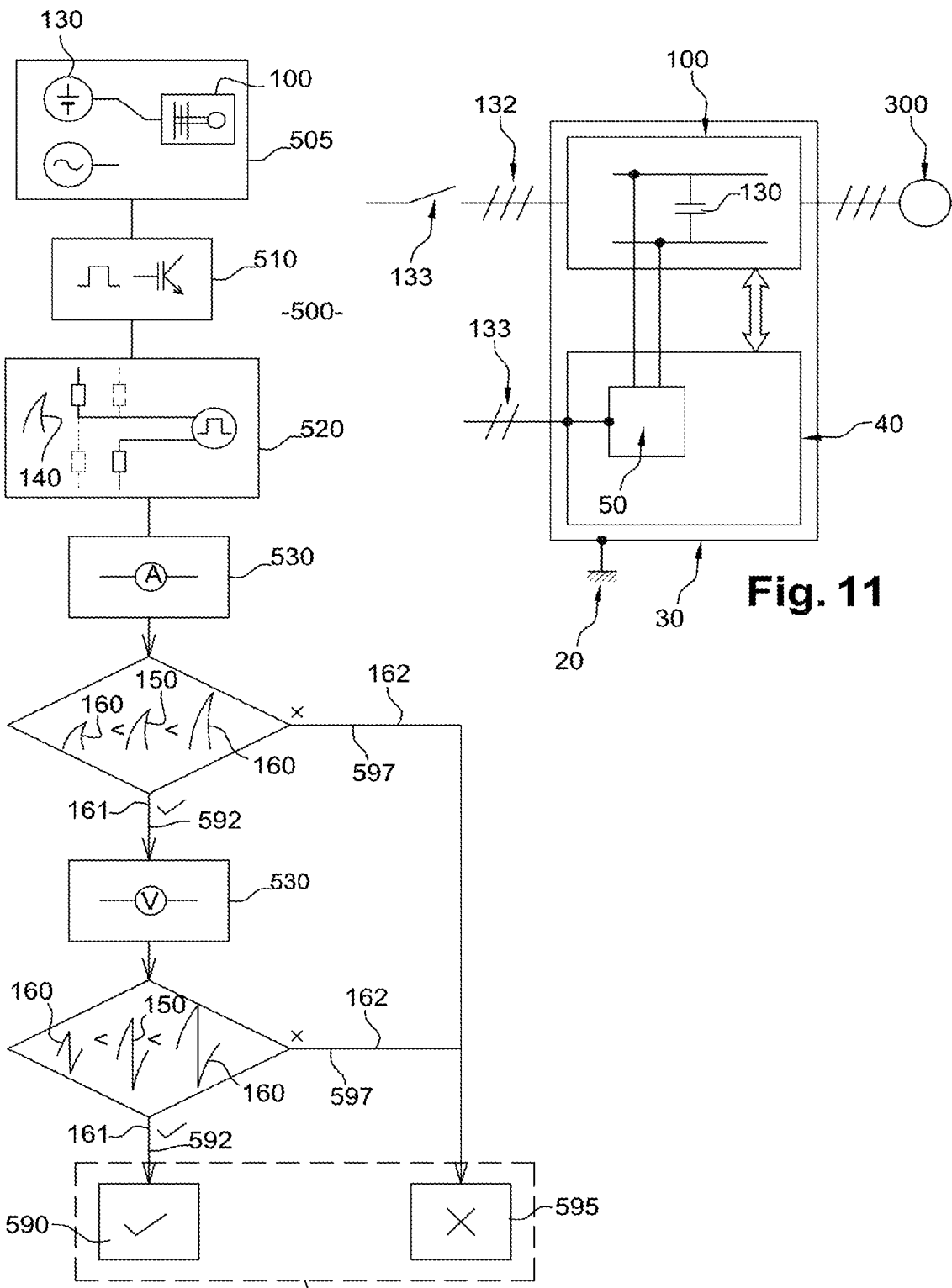

TESTABILITY METHOD FOR AN ELECTRONIC POWER CHAIN ASSOCIATED WITH AN ELECTRIC MOTOR

CROSS-REFERENCE TO RELATED APPLICATIONS

This application is a continuation of International Application No. PCT/FR2018/051279, filed on Jun. 1, 2018, which claims priority to and the benefit of FR 17/55005 filed on Jun. 6, 2017. The disclosures of the above applications are incorporated herein by reference.

FIELD

The present disclosure relates to an in-flight testability method for an electronic power chain of an aircraft component. The present disclosure also relates to an electronic case or to an electronic equipment integrating this electronic power chain of an aircraft component and this testability method, as well as to a nacelle and to an aircraft comprising the testability set of the present disclosure.

BACKGROUND

The statements in this section merely provide background information related to the present disclosure and may not constitute prior art.

An aircraft is propelled by several turbojet engines each housed in a nacelle also accommodating a set of auxiliary actuation devices related to its operation and ensuring various functions when the turbojet engine is in operation or at stop. These auxiliary actuation devices may for example consist of a mechanical thrust reverser system or a variable-section nozzle system.

The role of a thrust reverser, during the landing of an aircraft, is to improve the braking capacity of the latter by redirecting forward at least part of the thrust generated by the turbojet engine. In this phase, the thrust reverser allows returning all or part of the gas flows ejected by the turbojet engine to the front of the nacelle, thereby generating a counter-thrust which adds to the braking of the wheels of the aircraft.

The means implemented to carry out this reorientation of the flow vary depending on the thrust reverser type. However, in all cases, the structure of a thrust reverser comprises movable cowls displaceable between, on the one hand, a deployed position in which they open into the nacelle a passage or a section intended for the diverted flow, and on the other hand, a retracted position in which they close this passage. These movable cowls may furthermore fill a diverting function or simply a function of activating other diverting means.

In cascade-type thrust reversers, for example, the movable cowls slide along rails so that when moving rearward during the opening phase, they uncover the cascade vanes disposed across the thickness of the nacelle. A system of connecting rods connects this movable cowl to blocking doors which deploy inside the ejection channel and block the direct flow outlet.

In the door-type thrust reversers, each movable cowl pivots in such a way as to block the direct flow and divert it and is therefore active in this reorientation.

Moreover, an aircraft comprises, in a known manner, two electrical networks: a three-phase alternating-current electrical network delivering an alternating voltage called "high voltage," for example of 115 Volts (115V) or 230 Volts (230V), and a direct current electrical network called "low voltage" delivering for example a direct voltage of 28 Volts (28V).

Various components of the aircraft operate thanks to the three-phase alternating-current electrical network. To this end, these components comprise a three-phase electric motor supplied through a power converter by the three-phase alternating-current network of the aircraft. For example, the components that are supplied by the three-phase electrical network of the aircraft are the electric actuators of a thrust reverser cowl of a turbojet engine nacelle, the electric actuators of thrust reverser cowl locks intended to prevent the opening of the thrust reverser cowl when the aircraft is in flight, the electric actuators of movable panels of a variable-section secondary nozzle of a nacelle, the electrical system for the deployment of the landing gear, etc. The electronic power chain generally implemented to supply a three-phase electric motor of a component of the aircraft is as follows: the 115V (or 230V) alternating-current network of the aircraft supplies a rectifier-type converter which delivers a direct voltage; followed by a filtering stage generally referred to as "direct current bus" or "DC bus;" this voltage is then cut via an inverter-type converter in order to generate a three-phase signal supplying the electric motor of the component to be actuated. These different stages constituting the electronic chain are themselves controlled by a control electronics that may be integrated or not into the same case as the power electronics. In a known manner, the electronics may also incorporate a "BITE" function (standing for "Built In Test Equipment") monitoring the system and serving to detect some breakdowns of the control and power electronics.

In order to limit the risks of inadvertent actuation, in flight, of the components of the aircraft supplied by the 115V alternating-current network of the aircraft, this network is made available by the aircraft manufacturer only when the aircraft touches the ground. Indeed, the inadvertent actuation of some components of the aircraft in flight, such as for example that of the thrust reverser movable cowl, could turn out to be catastrophic. The permanent "non-availability," in flight, of this three-phase alternating-current network of the aircraft allows constituting one of the lines of defense imposed by the certification regulatory requirements.

In the case of an electric actuator of a nacelle thrust reverser, the 115V alternating-current network of the aircraft which supplies the three-phase electric motor is available only when the aircraft touches the ground, thanks to a system called "Weight On Wheel," allowing authorizing the delivery of a 115V alternating voltage to the electronic power chains piloting the three-phase motors of the actuation device of the thrust reverser as soon as said system has detected the contact of the aircraft with the ground. When the aircraft has landed and when the pilot controls the deployment of the thrust reverser system, the actuation device of the thrust reverser is supplied by the 115V alternating-current electrical network. The control and power electronics of this actuation device of the thrust reverser can then deliver the electric current necessary for piloting the electric motors, which motors causing an activation of the actuators ensuring the deployment or the retraction of the thrust reverser cowl(s).

In case of a dysfunction of the electronic power chain of one of the actuators of the thrust reverser device, the pilot detects this breakdown only when he controls the deployment of the thrust reverser, that is to say on the ground, when the aircraft has landed. The same applies for all the other components of the aircraft supplied by the three-phase alternating-current network of the aircraft and which can be actuated only when the aircraft has touched the ground.

This situation is uncomfortable for the pilot and for the efficiency of landing in particular in difficult configurations, because the pilot cannot anticipate a dysfunction of the aforementioned components before the aircraft has landed.

SUMMARY

This section provides a general summary of the disclosure and is not a comprehensive disclosure of its full scope or all of its features.

The present disclosure provides a testability method for the in-flight testing of an operating state of an electronic power chain comprising at least one power converter intended to pilot an electric motor, the electric motor actuating at least one aircraft component, the testability method comprising at least the following steps of:

controlling the actuation of the converter so as to generate an electric path passing through the electric motor;

transmitting at least one test signal in the electronic power chain;

collecting at least one measurement signal representative of the operating state of the electronic power chain; and determining an operating state of the power chain according to at least one test criterion of the at least one collected measurement signal, the at least one actuation control and the at least one transmitted test signal being configured so as to leave said at least one electric motor immobile during the steps of the testability method.

Thanks to these arrangements, it is possible to generate stimuli in the electronic power chain piloting the motor, which stimuli allow testing, in flight, the availability of some components of this power electronics, yet without actuating the electric motor. Consequently, the pilot can, in flight, check up the proper operation of the electrical chain in particular by detecting short-circuit or open circuit type defects present in the electronic power chain, forming in particular a converter, or in at least one portion of the motor circuit, in particular forming stator windings. By testing the availability of the electronic power chain shortly before landing, the pilot can then make a decision in the case where the tested component of the aircraft is not operational, such as for example that of landing on another landing runway that would be more adapted to the presence of the failure on the component of the aircraft.

According to one form, the test signal transmission step comprises the application of a low voltage supply originating from an electrical network of the aircraft, to said electronic power chain of the electric motor.

According to another form, the electronic power chain is isolated from the nominal power supply of the aircraft during the testability sequence of the method.

According to another form, the at least one measurement signal representative of the operating state of the electronic power chain is collected from at least one sensor belonging to the electronic power chain.

According to an aspect of the present disclosure, the at least one sensor may comprise a sensor for measuring a motor phase current or a sensor in the switching arms of the power converter, a current and/or voltage sensor of a DC bus of said electronic power chain.

According to one form, the at least one sensor may comprise a sensor for measuring a motor phase current or a sensor in the switching arms of the power converter, a current and/or voltage sensor of a direct current bus of said electronic power chain.

According to another form, the test signal transmission step comprises the injection of a sequence of electric pulses on the direct current bus.

According to another form, the test signal transmission step comprises the injection of a voltage ramp on the direct current bus.

According to yet another form, the operating state corresponds to an operative state or to an operation defect state. The operation defect state is obtained if at least one defect is detected by the testability method. The proper operation state is obtained if no defect is detected by the testability method.

According to still another form, the at least one test criterion defines a set of authorizations defining values of the at least one measurement signal corresponding to an operative state and a set of prohibitions defining values of the at least one measurement signal corresponding to an operation defect state.

According to another form, the test signal comprises a current component and/or a voltage component, and the authorization set comprises at least one current authorization set and/or at least one voltage authorization set.

The present disclosure also concerns a testability device for in-flight testing of an operating state of an electronic power chain comprising at least one power converter intended to pilot an electric motor; the electric motor actuating at least one component integrated to an aircraft turbojet engine nacelle; the testability device implements the testability method according to the present disclosure.

The present disclosure also concerns a nacelle for an aircraft turbojet engine comprising a thrust reverser device, said thrust reverser device comprising:

a cowl, movable between a deployed position in which said cowl opens a passage into said nacelle and a retracted position in which said cowl closes said passage; and at least one actuator configured to alternately move said cowl between said retracted and deployed positions, said actuator being controlled by the electric motor piloted by the power converter configured to be supplied by a three-phase alternating-current electrical network, said nacelle being characterized in that it further comprises a testability device according to the present disclosure.

Finally, the present disclosure concerns an aircraft comprising a component controlled by an electric motor piloted by at least one power converter configured to be supplied by a three-phase alternating-current electrical network, characterized in that it comprises a testability device according to the present disclosure.

Further areas of applicability will become apparent from the description provided herein. It should be understood that the description and specific examples are intended for purposes of illustration only and are not intended to limit the scope of the present disclosure.

DRAWINGS

In order that the disclosure may be well understood, there will now be described various forms thereof, given by way of example, reference being made to the accompanying drawings, in which:

FIG. 10 illustrates an example of a flow chart of the testability method according to one form of the present disclosure; and FIG. 11 discloses the testability device comprised in a control circuit integrated into an electronic case that comprises the electrical power chain and being connected to the aircraft ground according to the present disclosure.

Figure 1:
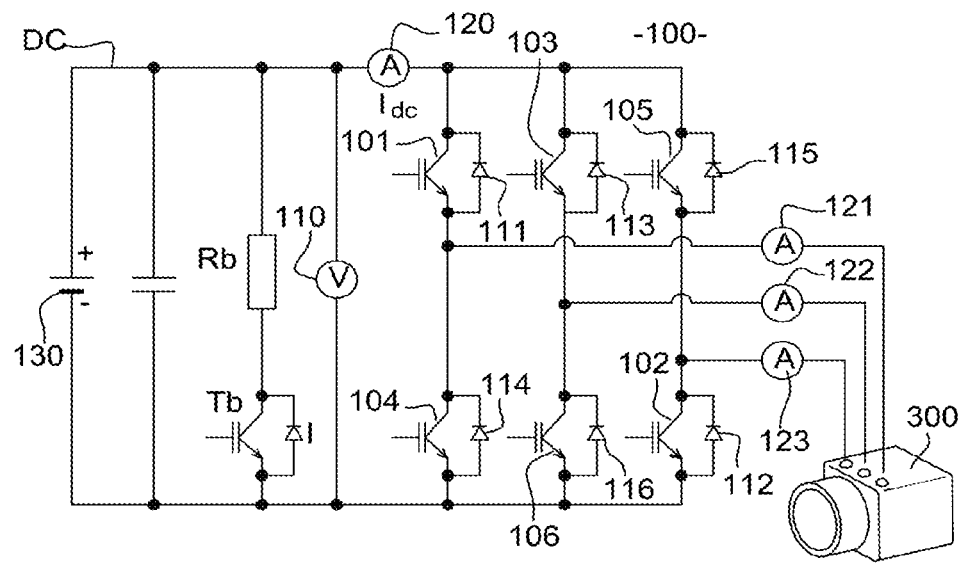
FIG. 1 illustrates an example of an electronic power chain 100 including an inverter-type power converter, in which the method according to the present disclosure is implemented.

The drawings described herein are for illustration purposes only and are not intended to limit the scope of the present disclosure in any way.

DETAILED DESCRIPTION

The following description is merely exemplary in nature and is not intended to limit the present disclosure, application, or uses. It should be understood that throughout the drawings, corresponding reference numerals indicate like or corresponding parts and features.

In the following detailed description of the figures defined above, the same elements or the elements filling identical functions may keep the same reference numerals so as to simplify the understanding of the present disclosure.

The testability method 500 of the present application applies to power converters and to electrical machines and is implemented by a testability device. At stop, test signals 140 are injected through switching arms and the corresponding measurement signals are compared with pre-established threshold values 160, in other words a threshold value 160 can be a current or voltage minimum value or a current or voltage maximum value, so as to indicate the operating state 540 of the system. The testability method 500 uses sensors for measuring the currents of the motor phases and the current and voltage sensors of the direct current bus 120 that are already installed in the system and does not need any specific sensor. The testability method 500 also operates if current sensors are used in the switching arms of the converter rather than in the motor phases. In addition, the method does not require a high computing power.

The testability method 500 detects the open circuit or short-circuit defects of the different components of the tested electronic chain. If one or several component(s) of this chain are defective during the test sequence, carried out in flight before landing, the testability method 500 indicates an operation defect state 595 showing that the system is not available and therefore not operable during a future use.

In FIG. 1, there is represented an electronic power chain of a motorized electrical system of an aircraft comprising an electric motor 300 configured to be piloted by a power converter 100 from a DC bus, the latter may for example come from a rectification, by an AC/DC converter, of a three-phase alternating voltage originating from an electrical network of the aircraft. The testability method 500 is used for testing the proper operation of this electronic power chain.

This electric motor 300 is located in a nacelle for an aircraft turbojet engine that may comprise a thrust reverser device composed of a cowl, movable between a deployed position in which the cowl opens a passage into the nacelle and a retracted position in which the cowl closes the passage and an actuator configured to alternately move the cowl between the retracted and deployed positions. The actuator is controlled by the electric motor 300 piloted by the power converter configured to be supplied by a three-phase alternating-current electrical network.

The testability device 50 is configured to test, in flight, an operating state 540 of an electronic power chain 100 comprising at least one power converter intended to pilot the electric motor 300. This electric motor 300 actuates a component integrated to the aircraft turbojet engine nacelle.

The testability method 500 is defined as a BITE-type function (Built In Test Equipment or In Situ test equipment) which allows knowing the operating state 540 of the system. This testability method 500 can be triggered by a control coming from any calculator of the aircraft.

Referring to FIG. 1, a simplified diagram of a voltage source inverter supplying a first phase 121, a second phase 122 and a third phase 123 of the permanent magnet synchronous machine 300, that is to say the electric motor 300, is illustrated. The three-phase converter, of the electronic power chain 100, conventionally comprises a set of switching arms composed of six insulated gate bipolar transistors 101, 102, 103, 104, 105, 106 with freewheel diodes 111, 112, 113, 114, 115, 116. Each switching arm comprises 2 insulated gate bipolar transistors and freewheel diodes.

The proposed testability method 500 uses the current sensors of the first phase 121, of the second phase 122 and of the third phase 123 of the electrical machine and the sensor of the direct current bus 120. These sensors are already present because they are used by the system for the nominal piloting of the electric motor and it is therefore not necessary to add them. This is also one of the advantages of the testability method 500 of the present application.

The testability method 500 uses the different switching arms of the voltage source inverter, by applying a test signal 140 at the level of the direct current bus. This test signal 140 may be in the form of a voltage step or a low-energy voltage ramp, that is to say a voltage ramp whose energy is less than 100 mJ, for a predetermined duration, so as to leave the electric motor 300 immobile during the steps of the testability method 500 described hereinafter.

According to a possibility described in FIG. 11, the testability device 50 is comprised in a control circuit 40 integrated into an electronic case 30 which also comprises the electrical power chain 100 and can be connected to the aircraft ground 20.

The testability device 50 implements the testability method 500 and comprises the electrical components desired for its proper operation. This testability device 50 is configured to sample with a sampling period at least twice shorter than the duration of the test signal 140. The testability device allows generating pulses of variable width and voltage value that can be injected on the positive of the direct current bus relative to the neutral of the aircraft network or of the aircraft ground if the neutral is connected to the aircraft ground, and on the negative of the direct current bus relative to the neutral of the aircraft network. This device also disconnects the connection to the neutral of the aircraft network or to the aircraft ground if the neutral is connected to the aircraft ground.

During a test signal 140 transmission step 520, the testability method 500 performs an activation of a low voltage supply of said electronic power chain 100 of the electric motor 300 from an electrical network of the aircraft.

Indeed, stimuli are generated in the electronic power chain 100 of the motor during the test signal 140 transmission step 520 by applying a low voltage supply of the testability device on the DC bus 130, which is in turn supplied from a low voltage direct current network 131 of the aircraft (typically the 28V direct current network of the aircraft); during the test sequence, the electronic power chain 100 is isolated 505 from the nominal power supply 132 of the aircraft (typically the 115V network of the aircraft) by a switch 133 which is open in flight.

These stimuli, that is to say these test signals 140 injected per pulse sequence or per voltage ramp, allow testing, in flight, the availability of some components of the aircraft, yet without actuating them.

In order to avoid any rotation of the electric motor 300 during the testability sequence 500, the voltage pulses have a short duration. The duration of the pulse is however at least longer than twice the sampling period of the sensors used by the testability device 500.

Consequently, the pilot or any other system of the aircraft can check up, in flight, the proper operation of the electrical chain and detect short-circuit or open circuit type defects present in the electronic power chain 100, and in particular in at least one portion of the motor circuit, such as for example a motor phase winding, and in particular also in at least one power transistor constituting the power converter.

Thus, by testing the operability of the electronic power chain shortly before landing, the pilot can for example make a decision in the case where a tested component of the aircraft is not operational, such as for example that of landing on a landing runway that would be more adapted to the presence of the failure on the component of the aircraft.

Figure 2:
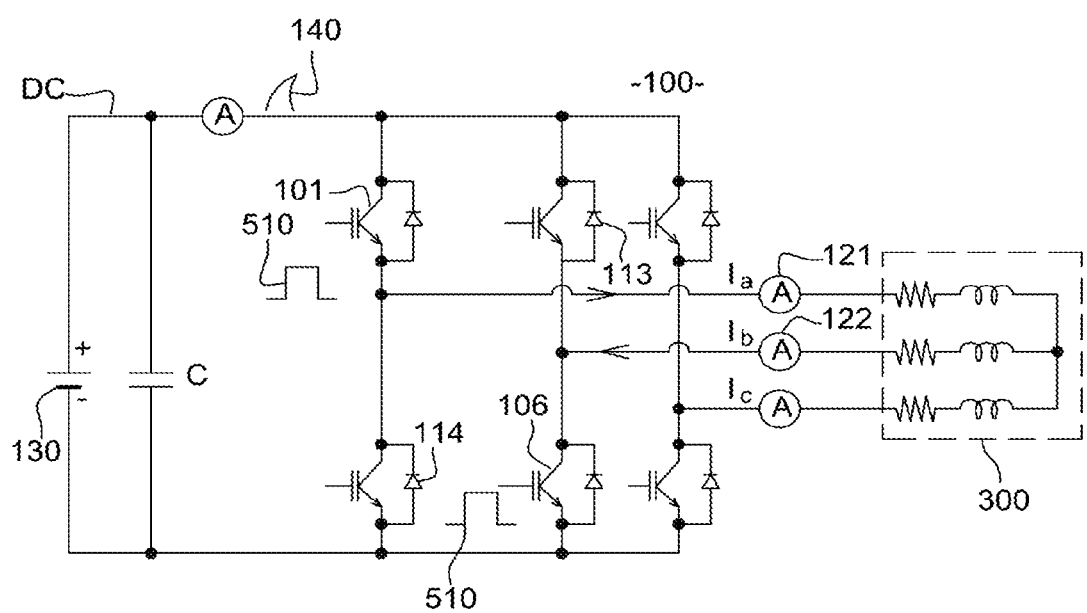
FIG. 2 illustrates a step of transmitting a first test signal in different phases of the motor according to the present disclosure.

Along with this test signal 140 transmission, the testability method 500 successively actuates the switching arms of the power converter 100 so as to generate an electrical path passing successively by each of the phases of the electric motor 300, during an actuation control step 510, as represented in FIG. 2.

FIG. 2 represents a first voltage square-wave type pulse 140 applied to the first and second motor phases 121, 122 through the transistors 101, 106 from the low voltage supply 130 of the testability device. The value of the current peak measured in the first phase 121 and in the direct current bus 120 is sampled and stored. The freewheel diodes 113, 114 provide the current continuity in the first and second phases 121, 122 when opening the transistors 101 and 106 at the end of the test pulse.

Figure 3:
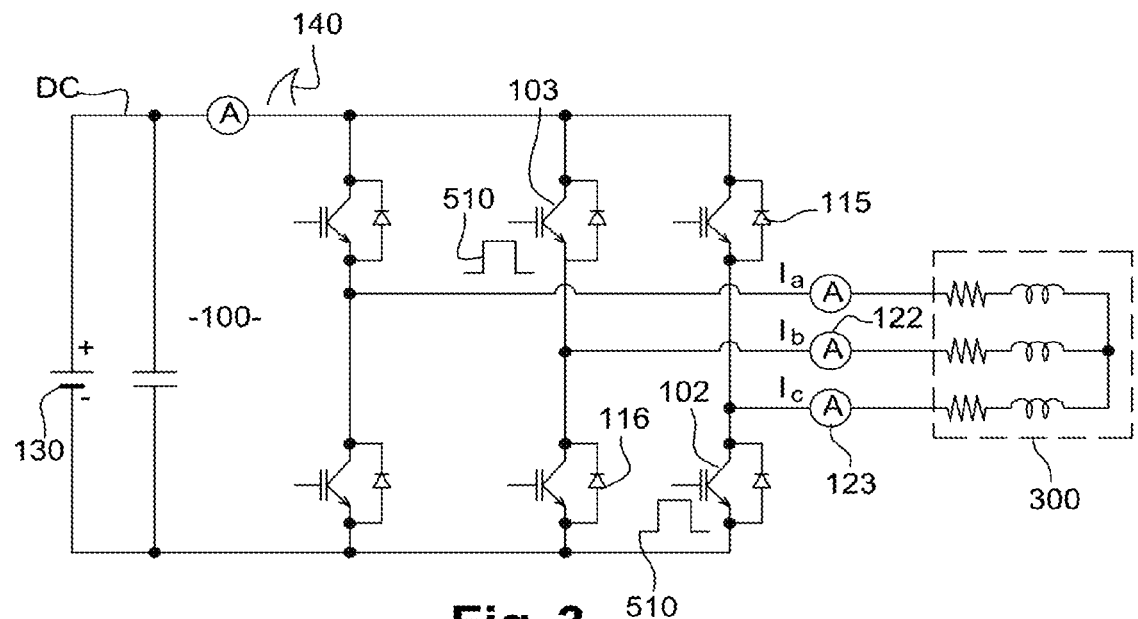
FIG. 3 illustrates a step of transmitting a second test signal in different phases of the motor according to the present disclosure.

The second voltage pulse 140, similar to the first one, is applied to the second and third motor phases 122, 123 throughout the transistors 103, 102 as illustrated in FIG. 3. The value of the peak currents measured in the second phase and in the direct current bus 120 is sampled and stored. The freewheel diodes 115, 116 provide the current continuity in the windings of the electrical machine when opening the transistors 102, 103 at the end of the test pulse.

Figure 4:
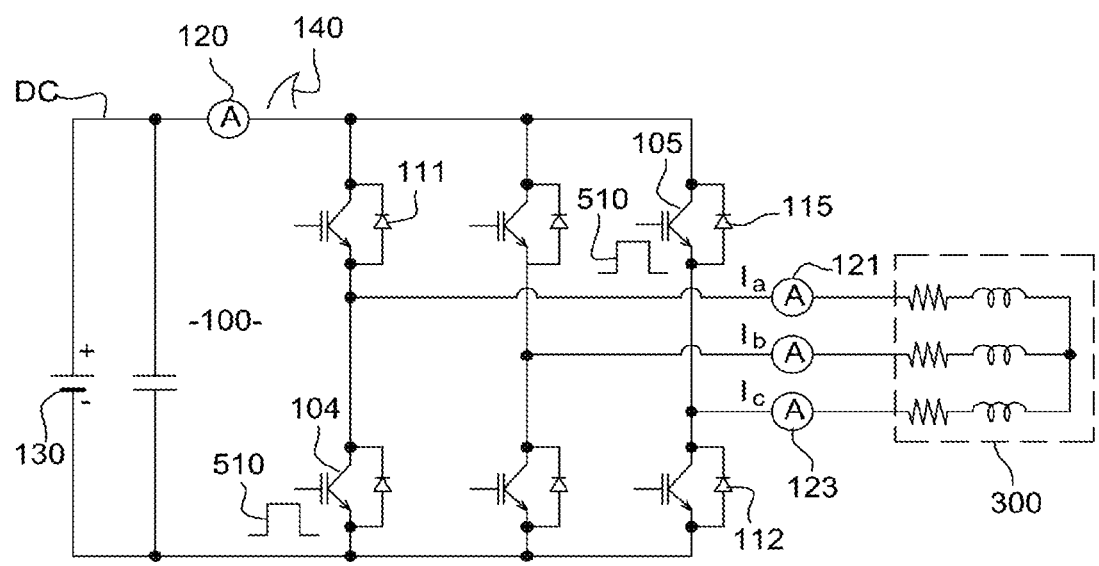
FIG. 4 illustrates a step of transmitting a third test signal in different phases of the motor according to the present disclosure.

The third voltage pulse 140, similar to the first and second pulses, is applied to the motor phases 121, 123 throughout the transistors 104, 105 as illustrated by FIG. 4. The value of the peak currents measured in the third phase 123 and in the direct current bus 120 is also sampled and stored. The freewheel diodes 111, 112 provide the current continuity in the windings of the machine when opening the transistors 104, 105 at the end of the test pulse.

This test signal 140 passes through the electronic power chain 100 and is transformed by the sensors of this same electronic power chain into a measurement signal 150 carrying information on the operating state 540 of the electronic power chain 100. This measurement signal 150 is collected by the testability method 500, in particular, the measurement signal 150 is collected by at least one sensor for measuring the current of a motor phase 121, 122, 123 or of a switching arm of the converter, a current and/or voltage sensor of a direct current bus 120.

The testability method 500 thus determines the operating state 540 of the power chain 100 according to a test criterion of the collected measurement signal 150.

As previously mentioned, the actuation control 510 and the transmitted test signal 140 are configured so as to leave the electric motor 300 immobile during the steps of the testability method 500. This is one of the features of the present disclosure.

In the case where the electronic power chain 100 is in a proper operation state 590, the testability method 500 confirms the proper operation state 590, in other words, the operability state of the permanent magnet synchronous machine 300 is confirmed. Indeed, the confirmation step comprises a step of authorizing 592 the use of the three-phase motor or a step of prohibiting 597 the use of the three-phase motor depending on the results of the step of checking up the set of test criteria.

Thus, it is possible to detect a breakdown of the electronic power chain 100 piloting an electric motor 300 without actuating the motor, on the one hand, and thus warn the user about an operation defect on the other hand.

This set of test criteria defines a threshold value 160 with a tolerance comprised between 2% and 5%, between a set of authorizations 161 in which said at least one electric motor 300 is in an operative state and a set of prohibitions 162 in which at least one operation defect in the electronic chain 100 impedes the proper operation of said at least one electric motor 300.

Figure 5:
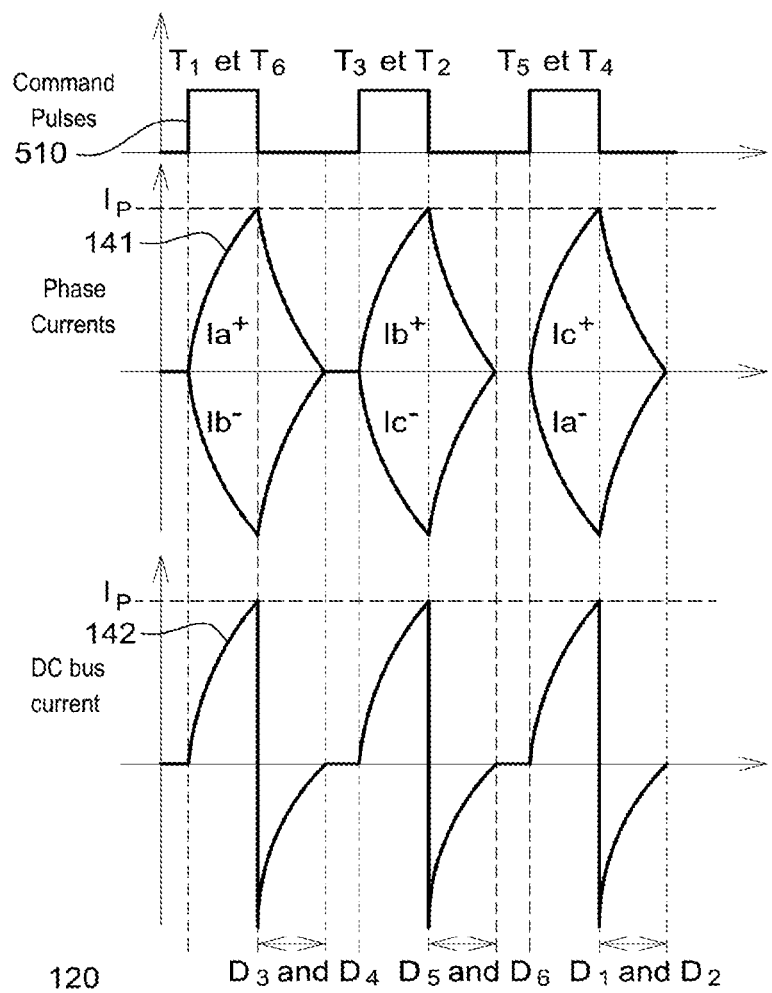
FIG. 5 illustrates an example of current components according to one form of the present disclosure.

For example, the test signal 140 may comprise voltage pulses applied 151 on the DC bus as shown in FIG. 5. The measured signals 150 may be for example a current component 141 measured at the level of the phases of the electrical machine 121, 122, 123 or else a component current 142 measured at the level of the direct current bus 120. In the case of the current component 141, the measurements of the currents of the phases of the machine 121, 122, 123 are compared to a minimum threshold and a maximum threshold 160 for the purpose of detecting a failure of the system either in open circuit or in short-circuit. The peak currents may slightly vary depending on the position of the rotor of the permanent magnet machine and on the value of the inductance of the stator coils, that is why the threshold values 160 of the testability method is selected according to the intrinsic variabilities of the electronic power chain.

The set of authorizations 161 may also comprise at least one set of current authorizations and at least one set of voltage authorization. If the permanent magnet synchronous machine 300, for example, has a short-circuit type defect, the current measurement of the direct current bus 141 would have a large value therefore higher than a pre-established threshold value. Similarly, the voltage measurement of the direct current bus would be practically zero therefore lower than a pre-established threshold value. These values 150 measured during the test sequence would not be comprised within the authorization set 161 but within the prohibition set 162.

In the case of an open circuit, the measurement of the phase currents 141 would be practically zero therefore lower than a pre-established threshold value and would not be comprised within the authorization set 161 but within the prohibition set 162.

In general, an open circuit or short-circuit defect occurs frequently in electric drive systems and can be detected by a testability method 500. For example, the failure of an open circuit transistor may result from a breakage in a bonding of the power component due to a thermal fatigue or a control defect of the transistor. The failure of a short-circuit transistor may result from a poor voltage control or a defect intrinsic to the component that may be caused by an overvoltage or an overtemperature.

By applying the voltage pulses 140 on the switching arms of the gates of the transistors 101, 106, the peak current passes through these two transistors 101, 106 and the two current sensors of the first and second phases 121, 122, as illustrated in FIG. 2.

If one of the transistors 101, 106 is in open circuit, the measured current is zero and therefore the testability method 500 indicates an operation defect state 595. The same sequence is applied with the other two control pulses as represented in FIGS. 3 and 4.

Figure 8:
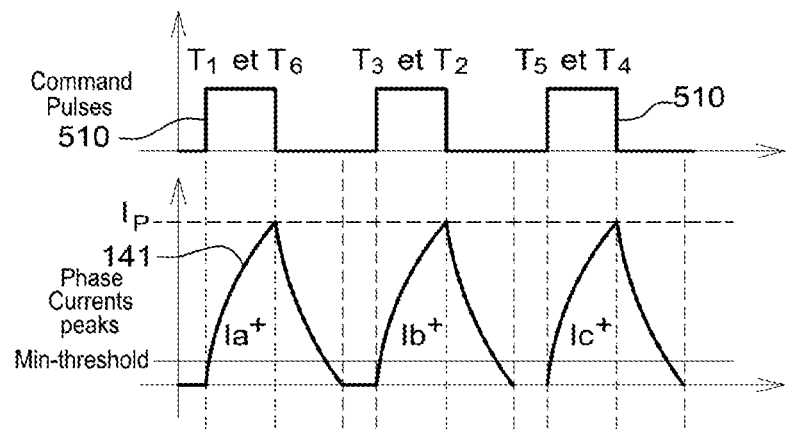
FIG. 8 illustrates a short-circuit failure testability step according to the present disclosure.

The testability method 500 compares the peak current value measured in the first and second phase with a minimum threshold value 160 as shown in FIG. 8. In order to take into account the imperfections of the current sensors, the minimum threshold value 160 can be higher than zero.

Thus, each of these test pulses allows detecting open circuit defects of the transistors 101, 102, 103, 104, 105, 106 of the converter or control defects of inadvertent opening of these transistors or open circuit defects of the phase windings of the electric motor 300.

Figure 6:
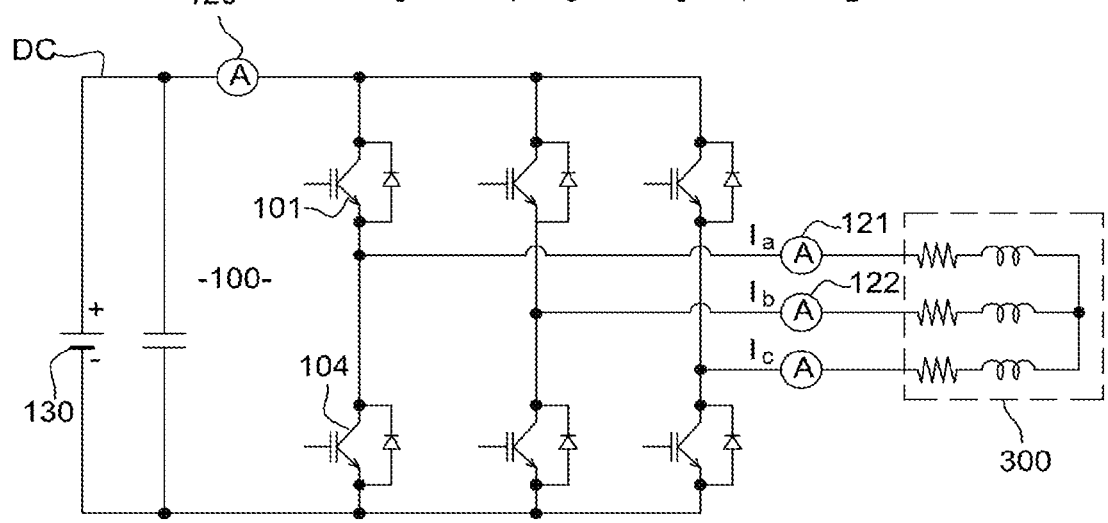
FIG. 6 illustrates an example of a short-circuit in a switching arm of the power converter according to the present disclosure.

In the case of a short-circuit of a transistor, the transistors of the same switching arm are turned-on as shown in FIG. 6 and the operating defect state 595 is detected by the current sensor of the direct current bus 120 since the current circulating in the short-circuit switching arm takes on a large value higher than a maximum threshold value 160.

Thus, each of these test pulses allows detecting short-circuit defects of the transistors 101, 102, 103, 104, 105, 106 of the converter or control defects of inadvertent closure of these transistors or open short-circuit defects of the phase windings of the electric motor 300.

Figure 7:
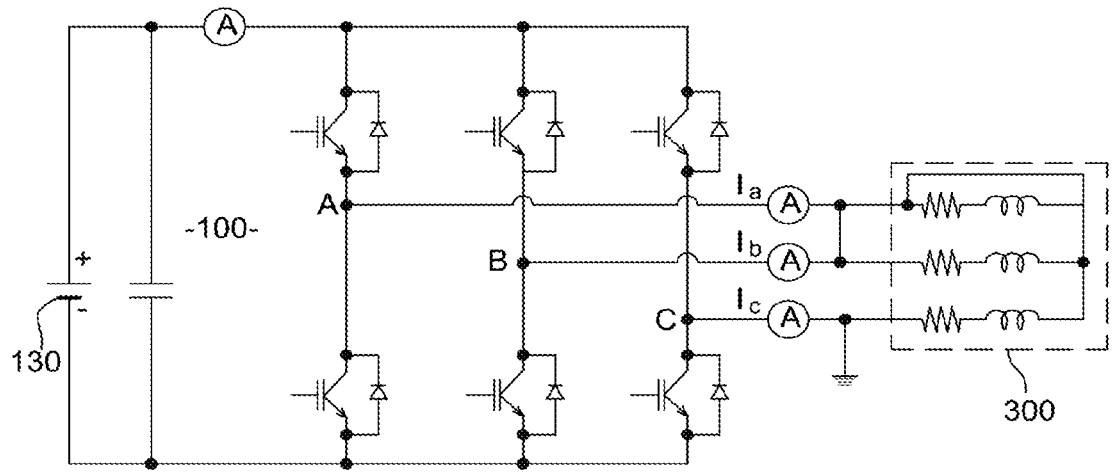
FIG. 7 illustrates examples of short-circuits at the level of the phases of the electric motor according to the present disclosure.

Motor short-circuit defects due for example to insulation defects represent a significant part of the defects that occur throughout the service life of an electric motor. The thermal, electrical environment and mechanical stress can cause short-circuits between the phases, between a phase and the ground and/or between a phase and the neutral of the motor as represented in FIG. 7.

A short-circuit defect in a phase of the stator generates a current in the direct current bus 120 larger than in the case of a sound circuit. As regards the short-circuit defects, the testability method 500 compares the measured current of the direct current bus 120 with a maximum threshold value 160 as illustrated in FIG. 8.

The duration of the test pulses 510 is selected so as to limit the peak value of the currents in the case of presence of a short-circuit in the electronic power chain 100. The testability method 500 also allows interrupting the voltage pulses injected when a short-circuit is detected by the device.

This testability principle also applies to any function connected to the DC bus, such as for example a function limiting the voltage of the power bus and allowing dissipating the energy reinjected by the electrical machine into a power resistance connected on this power bus.

The testability method 500 thus establishes a diagnosis of the operating state 540 of the tested electronic power chain 100. For this purpose, the testability method 500 analyzes measurements 150 after injecting test stimuli 140 and compares them to pre-established threshold values 160 in order to constitute a set of authorizations 161 and prohibitions 162. The non-operational state sanction 595 is established if at least one breakdown is detected by the testability method that is to say if at least one prohibition 162 is present. On the contrary, the operative state sanction 590 is established if no prohibition 162 is established, that is to say if no breakdown is detected during the test.

Figure 9:
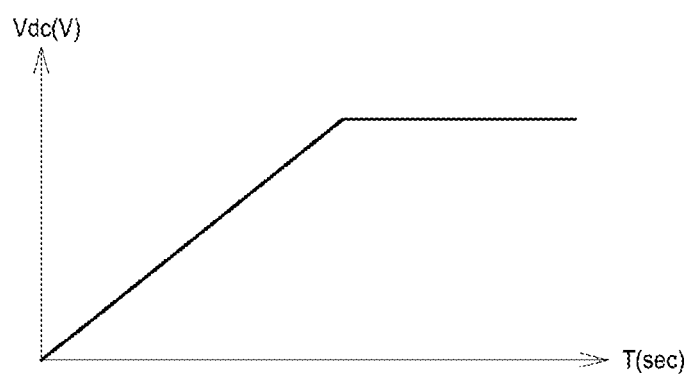
FIG. 9 illustrates an example of a voltage ramp according to the present disclosure.

The testability method 500 also allows testing whether a short-circuit is present in the components of the system. A transmission 520 of at least one test signal 140 in the form of a voltage ramp in the electronic power chain 100 is performed as represented in FIG. 9. During this transmission 520, the transistors 102, 104, 106 are controlled simultaneously so as to test the transistors 101, 103, 105.

This test signal 140 is generated by a current source that charges the capacitor C of the DC bus. If a short-circuit is present, the DC bus voltage remains zero or close to zero.

Henceforth, the testability method 500, represented in FIG. 10, collects 530 a measurement signal 150, more specifically an absence of voltage since the voltage of the DC bus remains zero or close to zero.

The testability method 500 determines 540 the operating state 590 of the power chain and in this instance that the operating state 590 of the electronic power chain is not in an operative state.

In the opposite case, that is to say if the voltage of the DC bus is higher than a minimum threshold value, then the testability method 500 determines 540 that the operating state 590 of the power chain is in an operative state because there is no short-circuit.

Subsequently to this voltage test step, the testability power supply is stopped and the DC bus voltage is discharged and it is the turn of the transistors 101, 103, 105 of each arm which are controlled simultaneously so as to test the transistors 102, 104, 106.

Again, a test signal 140 is generated by a current source which charges the capacitor C of the DC bus and if a short circuit is present, the DC bus voltage remains zero or close to zero.

As a result, the testability method 500 collects 530 the measurement signal 150 from the DC bus and determines 540 the operating state 590 of the power chain. As before, if the measurement signal 150 indicates that the electronic power chain is not in the operative state.

On the contrary, that is to say, if the voltage of the DC bus is higher than a minimum threshold value, then the testability method 500 determines 540 that the operating state 590 of the power chain is in an operative state because there is no short-circuit.

Unless otherwise expressly indicated herein, all numerical values indicating mechanical/thermal properties, compositional percentages, dimensions and/or tolerances, or other characteristics are to be understood as modified by the word "about" or "approximately" in describing the scope of the present disclosure. This modification is desired for various reasons including industrial practice, material, manufacturing, and assembly tolerances, and testing capability.

As used herein, the phrase at least one of A, B, and C should be construed to mean a logical (A OR B OR C), using a non-exclusive logical OR, and should not be construed to mean "at least one of A, at least one of B, and at least one of C."

The description of the disclosure is merely exemplary in nature and, thus, variations that do not depart from the substance of the disclosure are intended to be within the scope of the disclosure. Such variations are not to be regarded as a departure from the spirit and scope of the disclosure.

What is claimed is:

1. A testability method for in-flight testing of an operating state of an electronic power chain comprising at least one power converter to pilot an electric motor, the electric motor actuating at least one aircraft component, the testability method comprising:
   controlling actuation of the at least one power converter to generate an electric path passing through the electric motor;
   transmitting at least one test signal in the electronic power chain;
   collecting at least one measurement signal that is generated in response to the at least one test signal and that is representative of an operating state of the electronic power chain, the operating state relating to operability of the electronic power chain; and
   determining the operating state of the electronic power chain based on a comparison between the at least one measurement signal and at least one test criterion;
   wherein the at least one test signal is configured to generate stimuli in the electronic power chain to test, in flight, availability of the at least one aircraft component while making the at least one electric motor immobile and without actuating the at least one aircraft component, and
   wherein the electronic power chain is isolated from a nominal power supply of an aircraft during the testability method.

2. The testability method according to claim 1, wherein the transmitting at least one test signal step comprises applying a 28V voltage supply originating from an electrical network of the aircraft to the electronic power chain of the electric motor.

3. The testability method according to claim 1, wherein the at least one measurement signal representative of the operating state of the electronic power chain is collected from at least one sensor of the electronic power chain.

4. The testability method according to claim 1, wherein the transmitting at least one test signal step comprises injecting a sequence of electric pulses on a direct current bus.

5. The testability method according to claim 1, wherein the transmitting at least one test signal step comprises injecting a voltage ramp on a direct current bus.

6. The testability method according to claim 1, wherein the operating state corresponds to an operative state or to an operation defect state.

7. The testability method according to claim 6, wherein the at least one test criterion defines a set of authorizations defining values of the at least one measurement signal corresponding to an operative state and a set of prohibitions defining values of the at least one measurement signal corresponding to an operation defect state.

8. The testability method according to claim 1, wherein the at least one test signal comprises a current component and/or a voltage component, and an authorization set comprises at least one current authorization set and/or at least one voltage authorization set.

* * * * *